United States Patent
Kim et al.

(10) Patent No.: US 12,388,018 B2
(45) Date of Patent: Aug. 12, 2025

(54) DEVICE CHIP SCALE PACKAGE INCLUDING A PROTECTIVE LAYER AND METHOD OF MANUFACTURING A DEVICE CHIP SCALE PACKAGE

(71) Applicant: Amkor Technology Singapore Holding Pte. Ltd., Singapore (SG)

(72) Inventors: Tae Ki Kim, Incheon (KR); Jae Beom Shim, Incheon (KR); Seung Nam Son, Seoul (KR); Won Chul Do, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 18/669,033

(22) Filed: May 20, 2024

(65) Prior Publication Data

US 2024/0304550 A1     Sep. 12, 2024

Related U.S. Application Data

(63) Continuation of application No. 17/720,211, filed on Apr. 13, 2022, now Pat. No. 11,990,411, which is a
(Continued)

(51) Int. Cl.
*H01L 23/528* (2006.01)
*H01L 21/56* (2006.01)
(Continued)

(52) U.S. Cl.
CPC ........ *H01L 23/5283* (2013.01); *H01L 21/563* (2013.01); *H01L 21/565* (2013.01);
(Continued)

(58) Field of Classification Search
CPC . H01L 21/563; H01L 21/565; H01L 23/5283; H01L 23/3114; H01L 23/3128;
(Continued)

(56) References Cited

U.S. PATENT DOCUMENTS

| 10,157,871 B1 | 12/2018 | Yu et al. |
| 2012/0146209 A1 | 6/2012 | Hu et al. |

(Continued)

FOREIGN PATENT DOCUMENTS

| CN | 102543927 A | 7/2012 |
| CN | 104183597 A | 12/2014 |

(Continued)

OTHER PUBLICATIONS

TW Office Action mailed on Mar. 4, 2024 in TW Patent App. No. 109109445.
(Continued)

*Primary Examiner* — Matthew E. Gordon
(74) *Attorney, Agent, or Firm* — Spectrum IP Law Group LLC

(57) ABSTRACT

In one example, a semiconductor device comprises a redistribution layer (RDL) substrate having a top surface and a bottom surface, wherein the RDL substrate comprises a filler-free dielectric material, an electronic device on the top surface of the RDL substrate, an electrical interconnect on the bottom surface of the RDL substrate and electrically coupled to the electronic device, a first protective material contacting a side surface of the electronic device and the top
(Continued)

surface of the RDL substrate, and a second protective material contacting a side surface of the electrical interconnect and the bottom surface of the RDL substrate. Other examples and related methods are also disclosed herein.

20 Claims, 11 Drawing Sheets

Related U.S. Application Data continuation of application No. 16/387,924, filed on Apr. 18, 2019, now abandoned.

(51) Int. Cl.
  *H01L 23/00* (2006.01)
  *H01L 23/31* (2006.01)
(52) U.S. Cl.
  CPC ...... *H01L 23/3114* (2013.01); *H01L 23/3128* (2013.01); *H01L 24/09* (2013.01); *H01L 24/17* (2013.01); *H01L 2224/0231* (2013.01); *H01L 2224/02373* (2013.01); *H01L 2224/02381* (2013.01); *H01L 2224/0401* (2013.01)
(58) Field of Classification Search
  CPC . H01L 24/09; H01L 24/17; H01L 2224/0231; H01L 2224/02373; H01L 2224/02381; H01L 2224/0401
  USPC ......................................................... 257/690
  See application file for complete search history.

(56) References Cited

U.S. PATENT DOCUMENTS

| | | |
|---|---|---|
| 2016/0233187 A1 | 8/2016 | Kim et al. |
| 2016/0276174 A1 | 9/2016 | Kim et al. |
| 2018/0261573 A1* | 9/2018 | Chen ................... H01L 21/6835 |
| 2018/0323170 A1 | 11/2018 | Kim et al. |
| 2018/0331061 A1 | 11/2018 | He et al. |
| 2020/0203299 A1 | 6/2020 | Huang et al. |
| 2020/0294914 A1* | 9/2020 | Agarwal ............. H01L 25/0655 |
| 2020/0294915 A1 | 9/2020 | Chu et al. |
| 2020/0312766 A1* | 10/2020 | Bhagavat ............ H01L 21/6836 |
| 2021/0313269 A1 | 10/2021 | Bhagavat et al. |

FOREIGN PATENT DOCUMENTS

| | | |
|---|---|---|
| CN | 108573934 A | 9/2018 |
| TW | 201715662 A | 5/2017 |
| TW | 202038353 A | 10/2020 |

OTHER PUBLICATIONS

Office Action for China Application No. 202010297973.1 mailed Jan. 17, 2025.
Office Action for Taiwan Application No. 113137119 mailed Oct. 28, 2024.

* cited by examiner

DEVICE CHIP SCALE PACKAGE INCLUDING A PROTECTIVE LAYER AND METHOD OF MANUFACTURING A DEVICE CHIP SCALE PACKAGE

CROSS-REFERENCE TO RELATED APPLICATIONS

The present application is a continuation of U.S. application Ser. No. 17/720,211 filed Apr. 13, 2022, which is a continuation of U.S. application Ser. No. 16/387,924 filed Apr. 18, 2019 (abandoned). Said application Ser. No. 17/720,211, said application Ser. No. 16/387,924, US Pub. No. US 2020/0335441 A1, and US Pub. No. 2022/0238441 A1 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
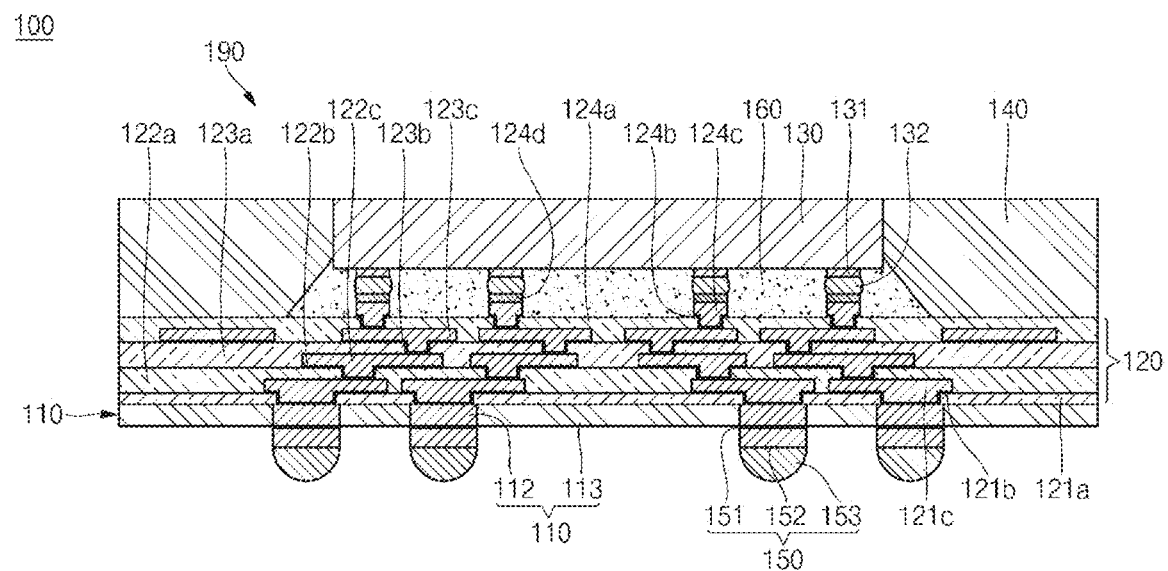
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The terms "or" and "and/or" include any single item, or any combination of the items, in the list joined by "or" or "and/or". As used in this disclosure, the singular forms are intended to include the plural forms as well, unless the context clearly indicates otherwise.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a redistribution layer (RDL) substrate having a top surface and a bottom surface, wherein the RDL substrate comprises a filler-free dielectric material, an electronic device on the top surface of the RDL substrate, an electrical interconnect on the bottom surface of the RDL substrate and electrically coupled to the electronic device, a first protective material contacting a side surface of the electronic device and the top surface of the RDL substrate, and a second protective material contacting a side surface of the electrical interconnect and the bottom surface of the RDL substrate.

In another example, a method to manufacture a semiconductor device comprises forming a base structure having a conductive post, forming a redistribution layer (RDL) substrate on the base structure, placing an electronic device on a top surface of the RDL substrate, and forming a protective material contacting a side surface of the electronic device and the top surface of the RDL substrate.

In a further example, a method to manufacture a semiconductor device comprises forming a redistribution layer (RDL) substrate on a first carrier, the RDL substrate having a top surface and a bottom surface, placing an electronic device on the top surface of the RDL substrate, forming a first protective material using a first molding operation, wherein the first protective material contacts a side surface of the electronic device and the top surface of the RDL substrate, attaching a second carrier to the first protective material, removing the first carrier from the RDL substrate, forming a conductive post on the bottom surface of the RDL substrate using a first plating operation, and forming a second protective material using a second molding operation, wherein the second protective material contacts a side surface of the conductive post and the bottom surface of the RDL substrate.

Other examples are included in the present disclosure. Such examples may be found in the figures, in the claims, and/or in the description of the present disclosure.

FIG. 1 shows a cross-sectional view of an example semiconductor device. In the example shown in FIG. 1, semiconductor device 100 can comprise a base structure 110, a substrate 120, an electronic device 130, an encapsulant 140 and interconnects 150. In addition, semiconductor device 100 can further comprise a dielectric layer 160 between substrate 120 and electronic device 130. In some examples, electronic device 130 can comprise an active device such as a semiconductor die or transistor, and in other examples electronic device 130 can comprise a passive device such as a resistor, a capacitor, an inductor, a connector, or equivalents.

Base structure 110 can comprise a conductive layer 112 and a dielectric layer 113. Substrate 120 can comprise dielectric layers 121a, 122a, 123a and 124a and conductive layers 121b, 122b, 123b, 124b, 121c, 122c, 123c, 124c and 124d. Electronic device 130 can comprise interconnects 131 and 132. Encapsulant 140 can contact a top surface of substrate 120 and a side surface of electronic device 130. In addition, interconnects 150 can comprise conductive layers 151, 152 and 153 and can be located on a bottom surface of base structure 110.

Base structure 110, substrate 120, encapsulant 140 and interconnects 150 can be referred to as a semiconductor package 190 or a package 190. In addition, semiconductor package 190 can protect electronic device 130 from external elements and/or environmental exposure. In addition, semiconductor package 190 can provide electrical coupling between an external device (not shown) and electronic device 130.

Figure 2A:
FIGS. 2A to 2L show cross-sectional views of an example method for manufacturing an example semiconductor device.

FIGS. 2A to 2L show cross-sectional views of an example method for manufacturing an example semiconductor device. FIG. 2A shows a process of providing a carrier 171 at an early stage of manufacture.

In the example shown in FIG. 2A, carrier 171 is substantially planar. In some examples, carrier 171 can be referred to as a board, a wafer, a panel or a strip as well. In addition, in some examples, carrier 171 can be made of any one or more of a metal (e.g., SUS), a wafer (e.g., silicon), ceramic (e.g., alumina), glass (e.g., soda-lime glass), or any equivalent. Carrier 171 can have a thickness in the range from approximately 500 μm to approximately 1500 μm and a width in the range from approximately 100 mm to approximately 500 mm. Carrier 171 can function to handle multiple components in an integrated manner during processes of forming base structure 110, forming substrate 120, and attaching and encapsulating electronic device 130. In some examples, carrier 171 can be commonly applied to all examples of this disclosure.

Figure 2B:
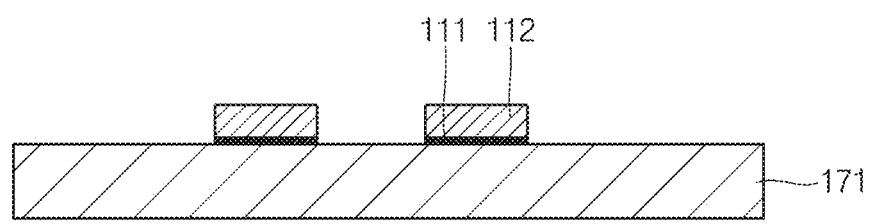

FIG. 2B shows a process of forming conductive layers 111 and 112 at a later stage of manufacture. In the example shown in FIG. 2B, conductive layer 111 can be formed on carrier 171. In some examples, conductive layer 111 can be referred to as a seed layer or a base layer. In some examples, seed layer 111 can be made of any of a variety of electrically conductive materials (e.g., titanium, tungsten, titanium/tungsten, copper, gold, silver, palladium, nickel, or an equivalent thereof). In addition, in some examples, seed layer 111 can be formed using any of a variety of processes (e.g., sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), or an equivalent thereof). Seed layer 111 can have a thickness in the range from approximately 500 angstrom (Å) to approximately 3000 Å. Seed layer 111 can facilitate forming conductive layer 112 to a predetermined thickness at a later stage of manufacture.

In addition, in the example shown in FIG. 2B, conductive layer 112 that is relatively thick can be formed on seed layer 111 that is relatively thin. In some examples, a pattern can be formed on seed layer 111 using a patterned mask (not shown) and relatively thick conductive layer 112 can be formed only within the pattern. In some examples, conductive layer 112 can be referred to as a conductive post or an under bump metal. In some examples, conductive post 112 can be made of any of a variety of electrically conductive materials (e.g., copper, gold, silver, or an equivalent thereof). Conductive post 112 can be formed using any of a variety of processes (e.g., sputtering, electroless plating, electroplating, PVD, CVD, MOCVD, ALD, LPCVD, PECVD or an equivalent thereof). After conductive post 112 is formed, the patterned mask can be removed. Additionally, relatively thin seed layer 111 formed around relatively thick conductive post 112 can also be removed using, for example, a soft etching process. Conductive post 112 can have a thickness in the range from approximately 1 μm to approximately 10 μm. Conductive post 112 can function to build up substrate 120 on conductive post 112 and to form interconnects 150 under conductive post 112 at later stages of manufacture.

Figure 2C:
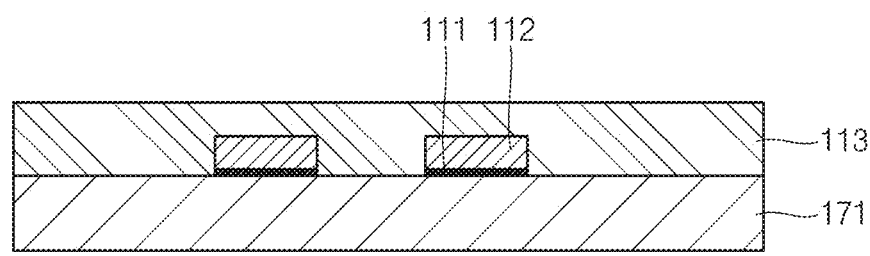

FIG. 2C shows a process of forming dielectric layer 113 at a later stage of manufacture. In the example shown in FIG. 2C, conductive posts 111 and 112 formed on carrier 171 can be covered by dielectric layer 113. In some examples, dielectric layer 113 can be formed using a molding operation, and dielectric layer 113 can contact a side of conductive post 112. In some examples, dielectric layer 113 can cover top and side surfaces of conductive post 112, and dielectric layer 113 may not cover a bottom surface of conductive post 112. In some examples, dielectric layer 113 may not cover the top surface of conductive post 112 to allow the top surface of conductive post 112 to be exposed to the outside through dielectric layer 113. In some examples, dielectric layer 113 can be referred to as an encapsulant, a sealant, an epoxy molding compound, a protective material, or an epoxy molding resin. In addition, in some examples, encapsulant 113 can also be referred to as an encapsulation part, a molding part, a protection part, or a body. In some examples, encapsulant 113 can comprise, but not limited to, an organic resin, an inorganic filler, a curing agent, a catalyst, a colorant, a flame retardant, or equivalents of the foregoing. Encapsulant 113 can be formed by any of a variety of processes including a molding operation. In some examples, encapsulant 113 can be formed by, but not limited to, compression molding, transfer molding, liquid-phase encapsulant molding, vacuum lamination, paste printing or film assist molding. Encapsulant 113 can have a thickness in the range from approximately 50 μm to approximately 100 μm. Encapsulant 113 can encapsulate conductive posts 111 and 112 to reduce or prevent substrate 120 from warping at a later stage.

Figure 2D:
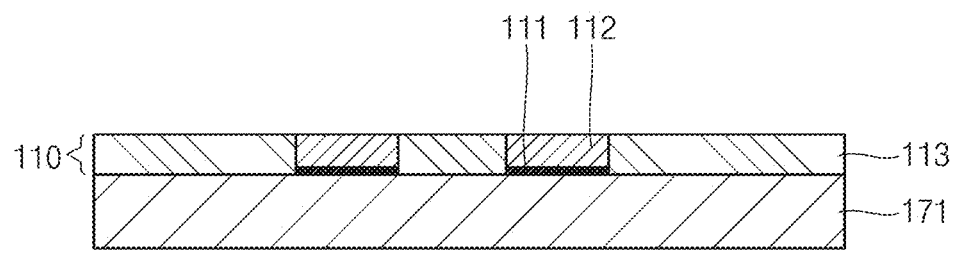

FIG. 2D shows a process for removing portions of conductive post 112 and encapsulant 113 at a later stage of manufacture. In the example shown in FIG. 2D, conductive post 112 and a top surface of encapsulant 113 are subjected to removal, such as by grinding or etching to make conductive post 112 and the top surface of encapsulant 113 coplanar. In some examples, conductive post 112 and the top surface of encapsulant 113 can be made to be coplanar by grinding and/or etching to improve planarity of substrate 120 formed on conductive post 112 and encapsulant 113. In such a manner, base structure 110 can be completed, substrate 120 can later be formed on base structure 110, and interconnects 150 can be formed under base structure 110.

Figure 2E:
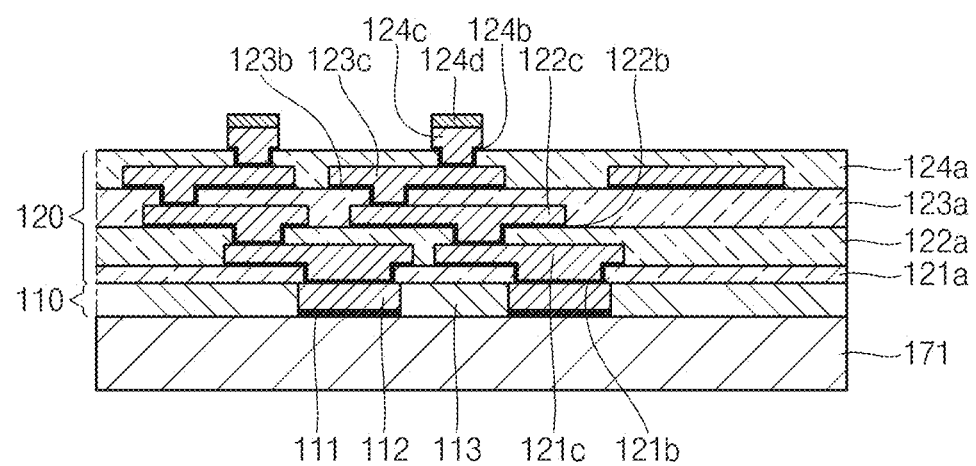

FIG. 2E shows a process of forming substrate 120 at a later stage of manufacture. In the example shown in FIG. 2E, substantially planar substrate 120 can be directly formed or built up on base structure 110. In an example, dielectric layers 121a, 122a, 123a and 124a and conductive layers 121b, 122b, 123b, 124b, 121c, 122c, 123c, 124c and 124d can be built up multiple times on base structure 110 to complete substrate 120.

In some examples, dielectric layer 121a can cover a top surface of base structure 110. Since the top surface of base structure 110 can be planar, dielectric layer 121a can also be planar. In some examples, dielectric layer 121a can be referred to as a passivation layer, an insulation layer or a protection layer. Dielectric layer 121a can be made of any of a variety of electrically non-conductive materials (e.g., $Si_3N_4$, $SiO_2$, SiON, polyimide (PI), benzocyclobutene (BCB), polybenzoxazole (PBO), bismaleimide triazine (BT), epoxy resin, phenol resin, silicone resin, acrylate polymer, or an equivalent thereof). In addition, dielectric layer 121a can be formed using any of a variety of processes (e.g., PVD, CVD, MOCVD, ALD, LPCVD, PECVD, printing, spin coating, spray coating, sintering, thermal oxidation, or an equivalent thereof). In some examples, dielectric layer 121a can be patterned to form an opening exposing conductive post 112 while covering encapsulant 113. Dielectric layer 121a can have a thickness in the range from approximately 1 µm to approximately 10 µm, and opening can have a width in the range from approximately 5 µm to approximately 70 µm.

In some examples, conductive layer 121b can be conformally formed on dielectric layer 121a and exposed conductive post 112. In some examples, conductive layer 121b can be referred to as a seed layer or base layer. In some examples, seed layer 121b can be formed on a top surface of dielectric layer 121a, a side wall of the opening, and the top surface of conductive post 112.

In some examples, seed layer 121b can be made of any of a variety of electrically conductive materials (e.g., titanium, tungsten, titanium/tungsten, copper, gold, silver, palladium, nickel, or an equivalent thereof). In addition, in some examples, seed layer 121b can be formed using any of a variety of processes (e.g., sputtering, electroless plating, electroplating, PVD, CVD, MOCVD, ALD, LPCVD, PECVD, or an equivalent thereof). Seed layer 121b can have a thickness in the range from approximately 500 Å to approximately 3000 Å. Seed layer 121b can facilitate forming conductive layer 121c to a predetermined thickness at a later stage of manufacture.

Although not shown, a mask can be formed on seed layer 121b to then be patterned by a general photolithography process. In some examples, seed layer 121b can be exposed to the outside by the patterned mask. In some examples, the patterned mask can include an opening that can expose a portion of seed layer 121b to the outside. In some examples, the mask can be referred to as a photoresist or a resin.

In some examples, conductive layer 121c that is relatively thick can be formed in the openings of the patterned mask on the exposed portions of seed layer 121b that is relatively thin. Here, since a pattern has already been formed using the mask, relatively thick conductive layer 121c can be formed only within the openings of the formed pattern. In some examples, conductive layer 121c can be referred to as a redistribution layer (RDL), a wiring pattern or a circuit pattern. In some examples, redistribution layer 121c can be made of any of a variety of electrically conductive materials (e.g., copper, gold, silver or an equivalent thereof). Redistribution layer 121c can be formed using any of a variety of processes (e.g., sputtering, electroless plating, electroplating, PVD, CVD, MOCVD, ALD, LPCVD, PECVD, or an equivalent thereof). After redistribution layer 121c is formed, the patterned mask can be removed. Additionally, relatively thin seed layer 121b formed under the patterned mask can be removed using, for example, a soft etching process after the patterned mask is removed. Redistribution layer 121c can have a thickness in the range from approximately 2 µm to approximately 10 µm. Redistribution layer 121c can function to electrically connect interconnects 131 and 132 of electronic device 130 to conductive post 112 of base structure 110.

The aforementioned processes are repeated multiple times to form substrate 120 on base structure 110. Here, conductive layer 124c formed on the topmost surface of substrate 120 can be referred to as a conductive pad, a micro pad or a bond pad. In some examples, conductive pad 124c can be formed to protrude a predetermined height from the top surface of substrate 120. Conductive pad 124c can have a width in the range from approximately 1 µm to approximately 80 µm.

In some examples, in order to prevent conductive pad 124c from being oxidized, an antioxidant layer 124d can be further formed on a top surface of conductive pad 124c. In some examples, antioxidant layer 124d can be referred to as a corrosion prevention layer or a solder spread improvement layer. In some examples, antioxidant layer 124d can be made of tin, gold, silver, nickel, palladium or an equivalent thereof. Antioxidant layer 124d can be formed using any of a variety of processes (e.g., sputtering, electroless plating, electroplating, PVD, CVD, MOCVD, ALD, LPCVD, PECVD, or an equivalent thereof). Antioxidant layer 124d can have a width in the range from approximately 1 µm to approximately 80 µm.

In some examples, substrate 120 can be referred to as an interconnection structure, a build-up structure, a circuit stack structure, an RDL structure, or a printed circuit board. In the example shown in this disclosure, substrate 120, which comprises four dielectric layers 121a, 122a, 123a and 124a, four conductive layers 121b, 122b, 123b and 124b and four conductive layers 121c, 122c, 123c and 124c, is illustrated. However, the quantity of these layers can be smaller than or greater than four.

Substrate 120 is presented as a redistribution layer (RDL) substrate in the example of FIG. 2. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In other examples, substrate 120 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process.

Figure 2F:
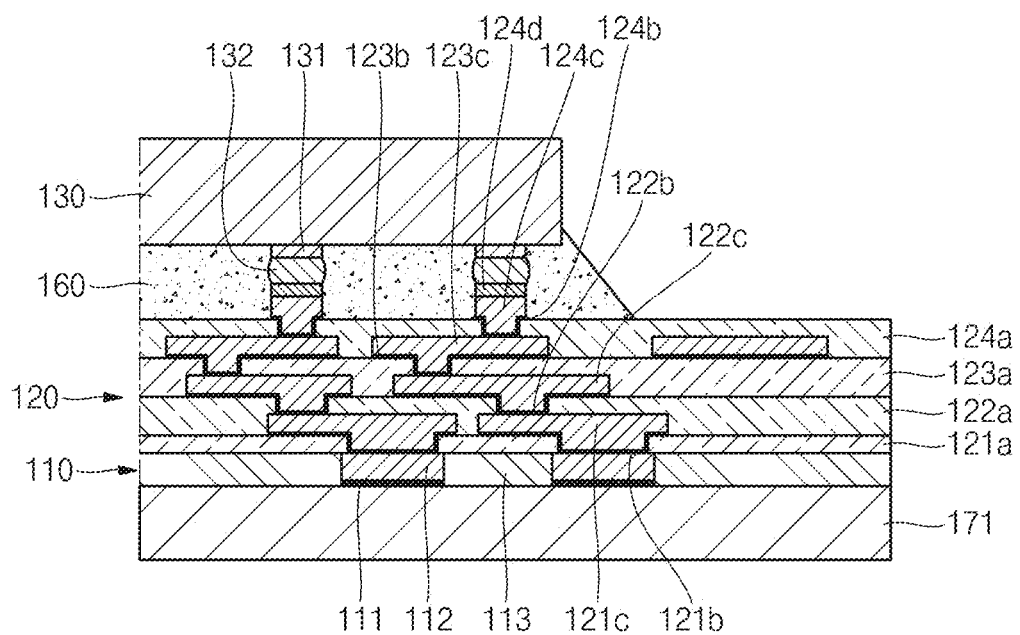

FIG. 2F shows a process of attaching electronic device 130 at a later stage of manufacture. In the example shown in FIG. 2F, electronic device 130 can be electrically connected to substrate 120. In some examples, a pick-and-place equipment (not shown) can pick up electronic device 130 to place electronic device 130 on conductive pad 124c of substrate 120. Next, electronic device 130 can be electrically connected to substrate 120, for example, by mass reflow, thermal compression or laser assist bonding.

In some examples, electronic device 130 can be referred to as a semiconductor die or a semiconductor chip. In addition, in some examples, electronic device 130 can comprise at least one of a logic die, a micro control unit, a memory, a digital signal processor, a network processor, a power management unit, an audio processor, an RF circuit, a wireless baseband system on chip processor, an application specific integrated circuit or an equivalent thereof.

In some examples, electronic device 130 can include an active region and a non-active region. In addition, in some examples, active region can be disposed to face substrate 120. In addition, in some examples, active region can include interconnects 131. In some examples, interconnects 131 can be referred to as die pads, bond pads, aluminum pads, conductive pillars or conductive posts. Interconnects 131 can have a width in the range from approximately 2 μm to approximately 80 μm.

In addition, each of interconnects 131 can be connected to a conductive pad 124c and/or antioxidant layer 124d of substrate 120 through low melting point material 132. In an example, low melting point material 132 can comprise any one or more of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, or any equivalent. Interconnect 131 of electronic device 130 and conductive pad 124c of substrate 120 can be electrically connected to each other by low melting point material 132.

In some examples, dielectric layer 160 can be further filled between substrate 120 and electronic device 130. In some examples, dielectric layer 160 can surround interconnects 131 of electronic device 130, low melting point material 132, conductive pad 124c and antioxidant layer 124d. In some examples, dielectric layer 160 can be referred to as an underfill, a capillary underfill (CUF), or a non-conductive paste. In some examples, underfill 160 can be a resin without an inorganic filler. In some examples, after electronic device 130 is electrically connected to substrate 120, underfill 160 can be injected into gaps between electronic device 130 and substrate 120 by a capillary to then be cured. In some examples, underfill 160 can be formed around the perimeter of the gap between electronic device 130 and substrate 120, and then underfill 160 will fill the gap through capillary forces. In some examples, underfill 160 can first be dispensed to cover conductive pad 124c disposed on substrate 120, and interconnect 131 of electronic device 130 and/or low melting point material 132 can then be electrically connected to conductive pad 124c while passing through underfill 160. Underfill 160 can prevent electronic device 130 from being electrically disconnected from substrate 120 due to physical shock or chemical shock.

Figure 2G:
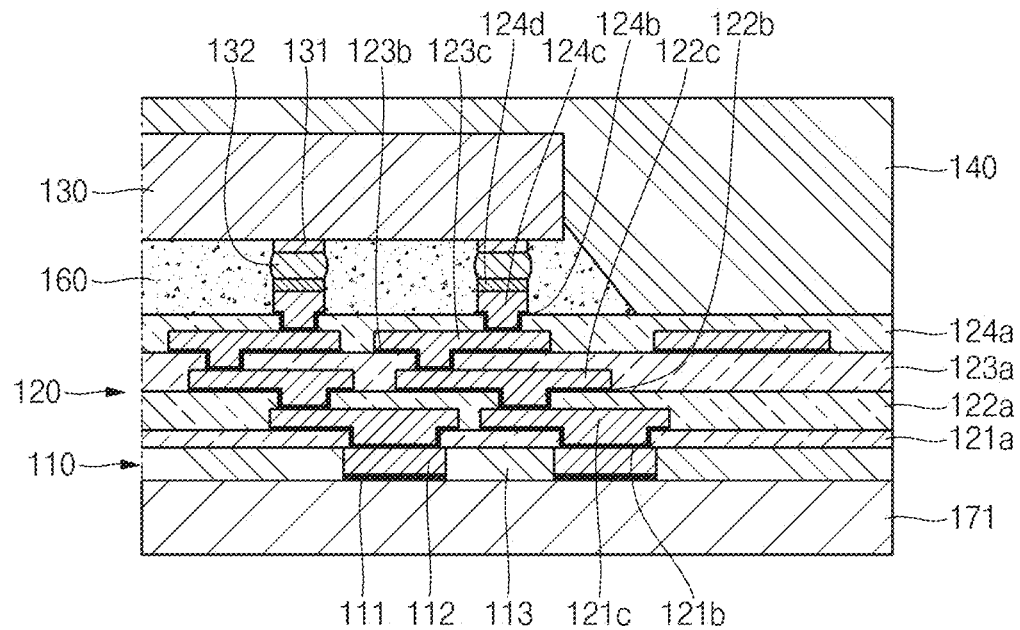

FIG. 2G shows an encapsulating process at a later stage of manufacture. In the example shown in FIG. 2G, electronic device 130 can be encapsulated by encapsulant 140. In some examples, encapsulant 140 can contact top and side surfaces of electronic device 130 and can contact underfill 160. However, in some examples, encapsulant 140 may not contact a bottom surface of electronic device 130 and a bottom surface of underfill 160. In some examples, encapsulant 140 may not contact the top surface of electronic device 130 to allow the top surface of electronic device 130 to be exposed to the outside through encapsulant 140. In some examples, encapsulant 140 can be referred to as an epoxy molding compound, an epoxy molding resin, a protective material, or a sealant. In addition, in some examples, encapsulant 140 can be referred to as a molding part, a sealing part, an encapsulation part, a package or a body. In some examples, encapsulant 140 can comprise, but not limited to, an organic resin, an inorganic filler, a curing agent, a catalyst, a colorant, or a flame retardant. Encapsulant 140 can be formed by any of a variety of processes. In some examples, encapsulant 140 can be formed by, but not limited to, a molding operation, compression molding, transfer molding, liquid-phase encapsulant molding, vacuum lamination, paste printing or film assist molding. Encapsulant 140 can have a thickness in the range from approximately 50 μm to approximately 1000 μm. Encapsulant 140 can encapsulate electronic device 130 to protect electronic device 130 from external elements and/or environmental exposure. In some examples, encapsulant 140 can serve as underfill, such as a molded underfill formed between substrate 120 and electronic device 130.

In some examples, a material forming encapsulant 140 can be the same with or different from that of base structure 110. When the material forming encapsulant 140 encapsulating electronic device 130 is the same with that of base structure 110, the coefficient of thermal expansion (CTE) of upper and lower regions of semiconductor device 100 can be substantially the same with each other to suppress warpage of semiconductor device 100.

For example, the CTE of substrate 120 can be different from that of encapsulant 140. Therefore, substrate 120 and encapsulant 140 can tend to warp or bend in one direction by the heat applied during the manufacturing process of the semiconductor package or the heat generated during electrical operation of the semiconductor package. However, encapsulants 113 and 140 can be selected to have same or similar CTEs, and can be formed on opposite upper and lower portions of the substrate 120, respectively. Thus, expansion or warpage due to the difference between the CTEs of encapsulant 140 and substrate 120 will tend to counteract expansion or warpage due to the difference between the CTEs of encapsulant 113 and substrate 120. Accordingly, even if heat is applied during the manufacturing process of the semiconductor package or heat is generated during the electrical operation of the semiconductor package, the amount of warpage that the semiconductor package is bent in one direction can be suppressed or reduced. In some examples, the CTE of substrate 120 can be greater than the CTE of encapsulant 140 and greater than the CTE of encapsulant 113.

There can also be examples where the material forming encapsulant 140 encapsulating electronic device 130 can be made different from that of encapsulant 113 and/or base structure 110 while still improving the warpage of semiconductor device 100. For example, the material or CTEs of encapsulant 140 and of encapsulant 113 can be selected, even if different from each other, such that when also considering the thickness of encapsulant 140, the thickness of encapsulant 113, and/or the presence of electronic device 130, the net effect is that warpage due to the interface between substrate 120 and encapsulant 140 counteracts warpage along the interface between substrate 120 and encapsulant 113.

Figure 2H:
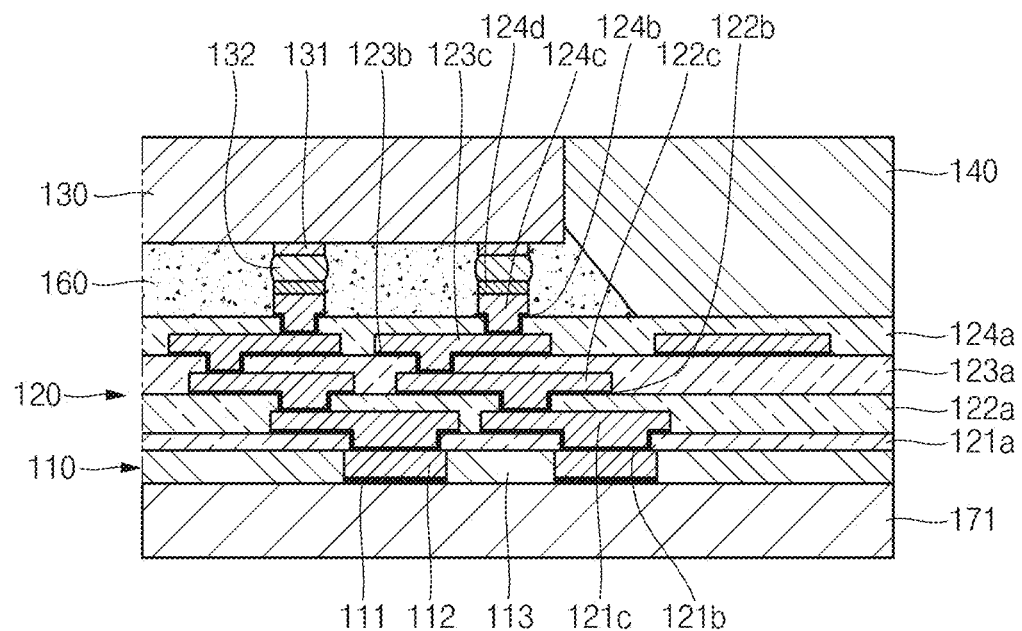

FIG. 2H shows a process of removing a portion of molding part 140 at a later stage of manufacture. In the example shown in FIG. 2H, molding part 140 can be subjected to grinding and/or etching, thereby exposing the top surface of electronic device 130 to the outside. The removing process can be performed until the thickness of electronic device 130 becomes smaller than approximately 500 μm. As the result of the removing process, a top surface of molding part 140 can be coplanar with the top surface of electronic device 130.

Figure 2I:
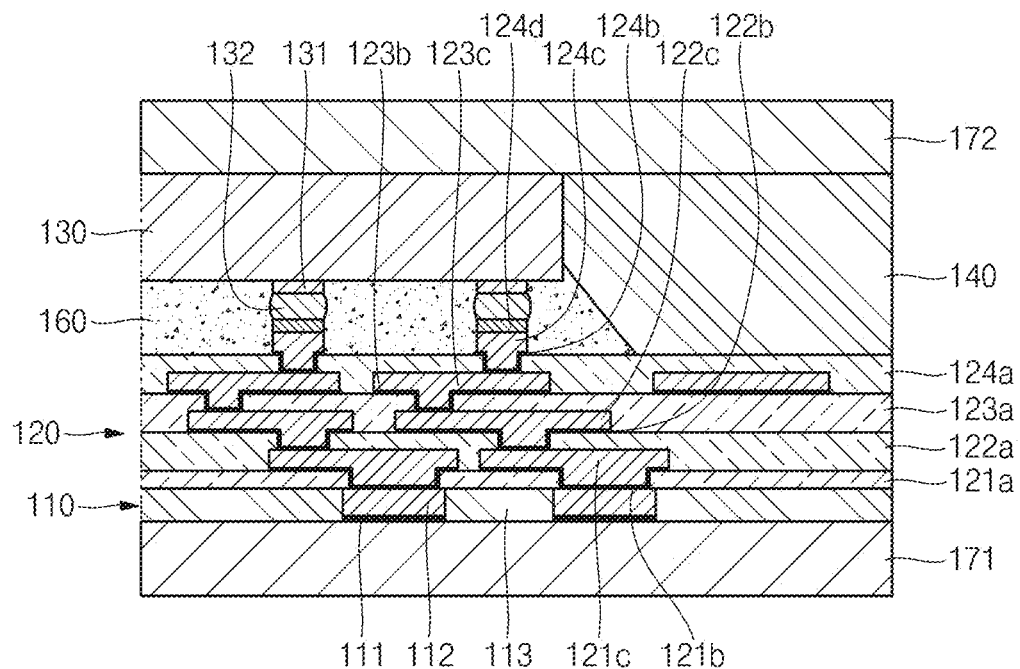

FIG. 2I shows a process of attaching a carrier 172 at a later stage of manufacture. In the example shown in FIG. 2I, carrier 172 can be attached to molding part 140 and the top surface of electronic device 130. In some examples, carrier 172 can be attached to molding part 140 and the top surface of electronic device 130 using a temporary adhesive layer. The temporary adhesive layer can be made of a material configured to lose its adhesiveness when exposed to heat or light. Upper carrier 172 can fix or support the device while removing lower carrier 171. Upper carrier 172 can be substantially planar. In some examples, upper carrier 172 can be referred to as a board, a wafer, a panel or a strip as well. In addition, in some examples, upper carrier 172 can be made of any one or more of a metal (e.g., SUS), a wafer (e.g., silicon), ceramic (e.g., alumina), glass (e.g., soda-lime glass), or any equivalent. Upper carrier 172 can have a thickness in the range from approximately 500 μm to approximately 1500 μm and a width in the range from approximately 100 mm to approximately 500 mm.

Figure 2J:
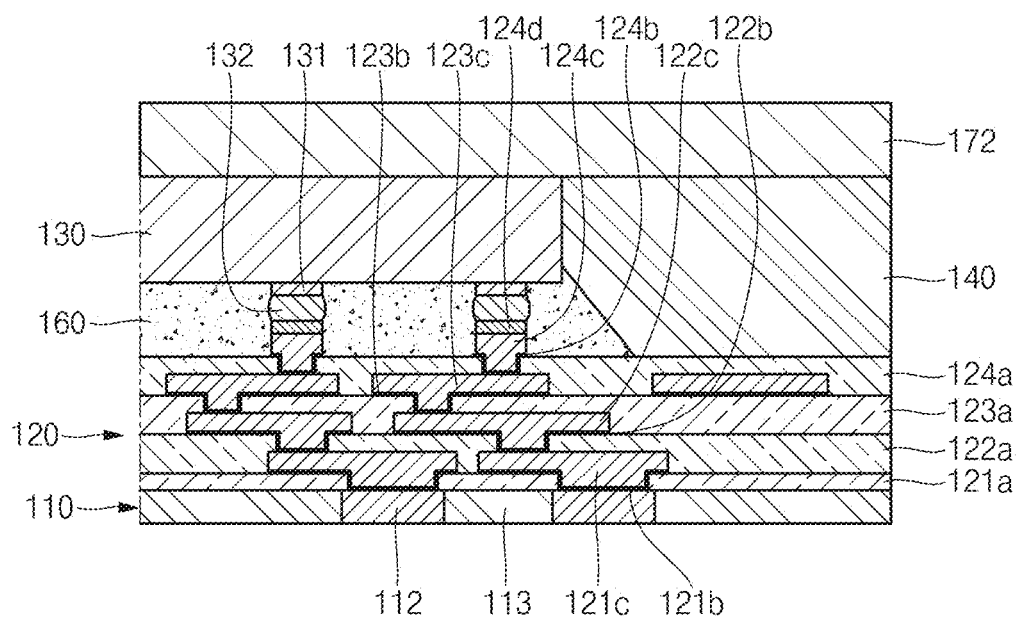

FIG. 2J shows a process of removing carrier 171 at a later stage of manufacture. In the example shown in FIG. 2J, carrier 171 can be removed from base structure 110. In some examples, carrier 171 can be removed by grinding and/or etching using a grinding operation and/or an etching operation. In some examples, when grinding and/or etching is performed on carrier 171, seed layer 111 formed on the bottom surface of conductive post 112 can also be removed. Therefore, the bottom surface of conductive post 112 can be exposed to the outside through encapsulant 113. In some examples, the bottom surface of conductive post 112 can be coplanar with the bottom surface of encapsulant 113.

Figure 2K:
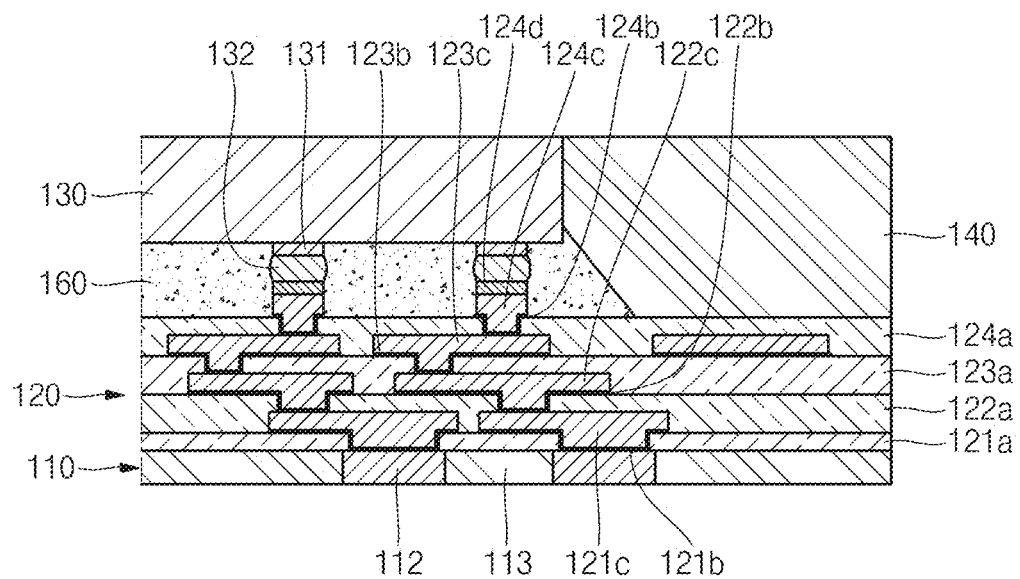

FIG. 2K shows a process of removing carrier 172 at a later stage of manufacture. In the example shown in FIG. 2K, upper carrier 172 can also be removed. As described above, the top surface of electronic device 130 and the top surface of encapsulant 140 can be coplanar on semiconductor device 100, while the bottom surface of conductive post 112 of base structure 110 and the bottom surface of encapsulant 113 can be coplanar under semiconductor device 100. In some examples, carrier 172 may be removed using grinding operation and/or an etching operation in the same manner or in a manner similar to the removal of carrier 171 as discussed with respect to FIG. 2J, above.

Figure 2L:
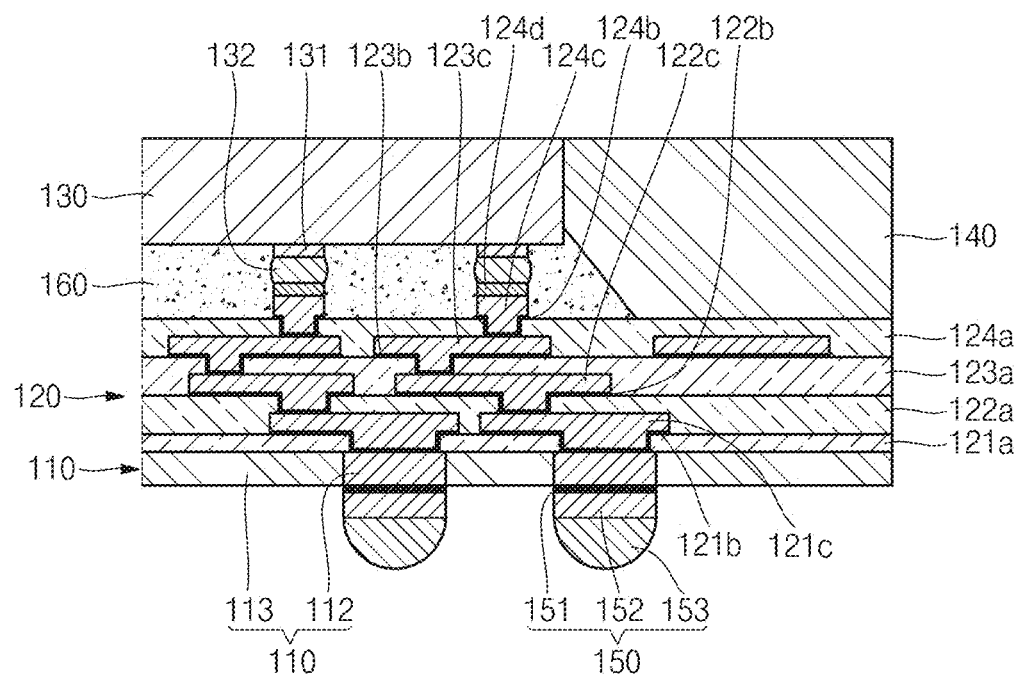

FIG. 2L shows a process of forming interconnects 150 at a later stage of manufacture. In the example shown in FIG. 2L, conductive layer 151 that is relatively thin can be formed on the entire bottom surface of base structure 110, and conductive layer 152 that is relatively thick can be formed on relatively thin conductive layer 151. In some examples, relatively thin conductive layer 151 can be referred to as a seed layer or base layer. In some examples, seed layer 151 can be formed on bottom surfaces of conductive post 112 and encapsulant 113.

Seed layer 151 can be made of any of a variety of electrically conductive materials (e.g., titanium, tungsten, titanium/tungsten, copper, gold, silver, palladium, nickel or an equivalent thereof). In addition, in some examples, seed layer 151 can be formed using any of a variety of processes (e.g., sputtering, electroless plating, electroplating, PVD, CVD, MOCVD, ALD, LPCVD, PECVD, or an equivalent thereof). Seed layer 151 can have a thickness in the range from approximately 500 Å to approximately 3000 Å. Seed layer 151 can facilitate forming conductive layer 152 to a predetermined thickness at a later stage of manufacture.

In some examples, relatively thick conductive layer 152 can be formed on relatively thin seed layer 151. In some examples, a pattern or opening can be formed on seed layer 151 using a patterned mask (not shown) and relatively thick conductive layer 152 can be formed only within the pattern or the opening. In some examples, conductive layer 152 that is relatively thick can be formed in the patterns of the patterned mask on the exposed portions of seed layer 151 that is relatively thin. Here, since a pattern has already been formed using the mask, relatively thick conductive layer 152 can be formed only within the openings of the formed pattern. In some examples, conductive layer 152 can be referred to as a conductive pillar or a conductive post. In some examples, conductive pillar 152 can be made of any of a variety of electrically conductive materials (e.g., copper, gold, silver or an equivalent thereof). Conductive pillar 152 can be formed using any of a variety of processes (e.g., sputtering, electroless plating, electroplating, PVD, CVD, MOCVD, ALD, LPCVD, PECVD, or an equivalent thereof). After conductive pillar 152 is formed, the patterned mask can be removed. Additionally, relatively thin seed layer 151 formed around relatively thick conductive pillar 152 can also be removed using, for example, a soft etching process. Conductive pillar 152 can have a thickness in the range from approximately 5 µm to approximately 50 µm.

In some examples, interconnect tip 153 having a relatively low melting point material can be connected to conductive pillar 152. In some examples, interconnect tip 153 can have a lower melting point than conductive pillar 152. In some examples, interconnect tip 153 can be referred to as a solder ball, a solder bump, a solder cap, a conductive ball, a conductive bump, or a conductive cap. In some examples, after dispensing solder to a bottom surface of conductive pillar 152, interconnect tip 153 can be formed on the bottom surface of conductive pillar 152 by a mass reflow process. In some examples, the patterned mask that is used to form conductive pillar 152 can be re-used to form interconnect tip 153. In some examples, interconnect tip 153 can be formed in the patterns or openings of the patterned mask on the exposed portions of conductive pillar 152. Here, since a pattern has already been formed using the mask, interconnect tip 153 can be formed only within the openings of the pattern. In some examples, interconnect tip 153 can comprise any one or more of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, or any equivalent. Interconnect tip 153 can have a thickness in the range from approximately 0.5 µm to approximately 30 µm and a width in the range from approximately 2 µm to approximately 80 µm. After interconnect tip 153 is formed, the patterned mask can be removed. In some examples, if interconnect tip 153 is formed using the patterned mask, seed layer 151 formed around conductive pillar 152 and interconnect tip 153 can now be removed using, but not limited to, a soft etching process.

As described above, interconnects 150, which comprises seed layer 151, conductive pillar 152 and interconnect tip 153, can be completed. Interconnects 150 can function to electrically connect semiconductor device 100 or semiconductor package 190 to an external device (not shown). Although interconnects 150 are shown as being formed after carrier 172 is removed, this is not a limitation of the present disclosure. In other examples, interconnects 150 can be formed before carrier 172 is removed.

Figure 3:
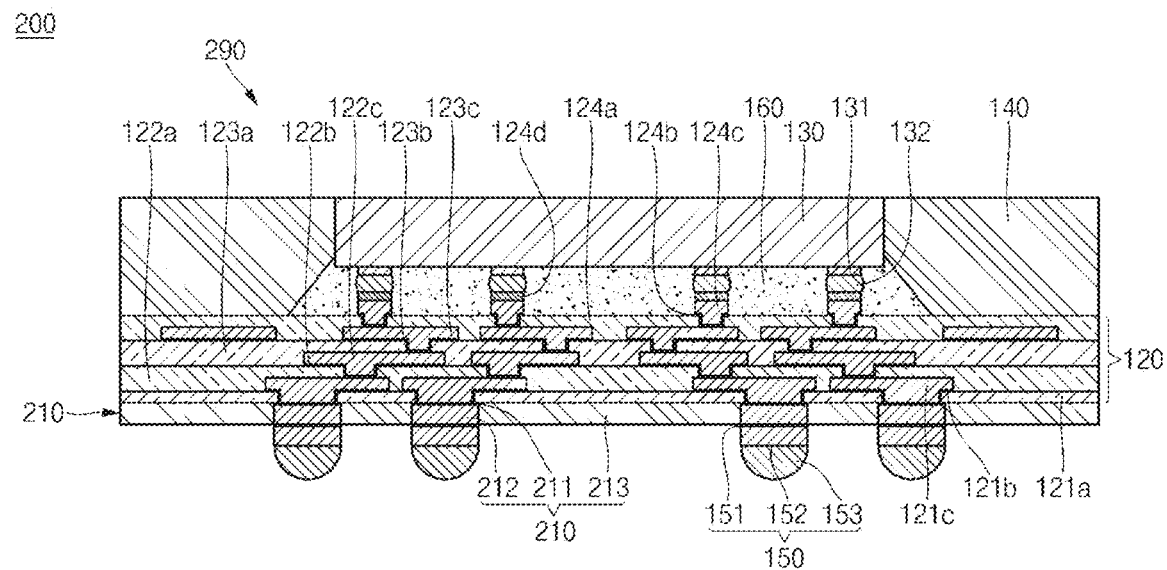
FIG. 3 shows a cross-sectional view of another example semiconductor device.

FIG. 3 shows a cross-sectional view of another example semiconductor device. Semiconductor device 200 shown in FIG. 3 can have a different structure from that of semiconductor device 100 shown in FIG. 1 due to processing differences of manufacture. In the example shown in FIG. 3, semiconductor device 200 can comprise a substrate 120, an electronic device 130, an encapsulant 140, a base structure 210 and interconnects 150.

Substrate 120 can comprise dielectric layers 121a, 122a, 123a and 124a and conductive layers 121b, 122b, 123b, 124b, 121c, 122c, 123c, 124c and 124d. Electronic device 130 can comprise interconnects 131 and 132. Encapsulant 140 can contact a top surface of substrate 120 and a side surface of electronic device 130. Base structure 210 can comprise conductive layers 211 and 212 and a dielectric layer 213. In addition, interconnects 150 can be located on a bottom surface of base structure 210.

Substrate 120, encapsulant 140, base structure 210 and interconnects 150 can be referred to as a semiconductor package 290 or a package 290. Semiconductor package 290 can protect electronic device 130 from external elements and/or environmental exposure. In addition, semiconductor package 290 can provide electrical coupling between an external device (not shown) and electronic device 130.

Figure 4A:
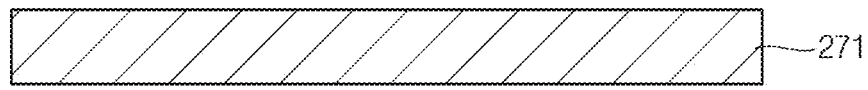
FIGS. 4A to 4K show cross-sectional views of an example method for manufacturing another example semiconductor device.

FIGS. 4A to 4K show cross-sectional views of an example method for manufacturing another example semiconductor device. FIG. 4A shows a process of providing a carrier 271 at an early stage of manufacture.

In the example shown in FIG. 4A, carrier 271 can have substantially the same shape and characteristic with those of carrier 171 shown in FIG. 2A.

Figure 4B:
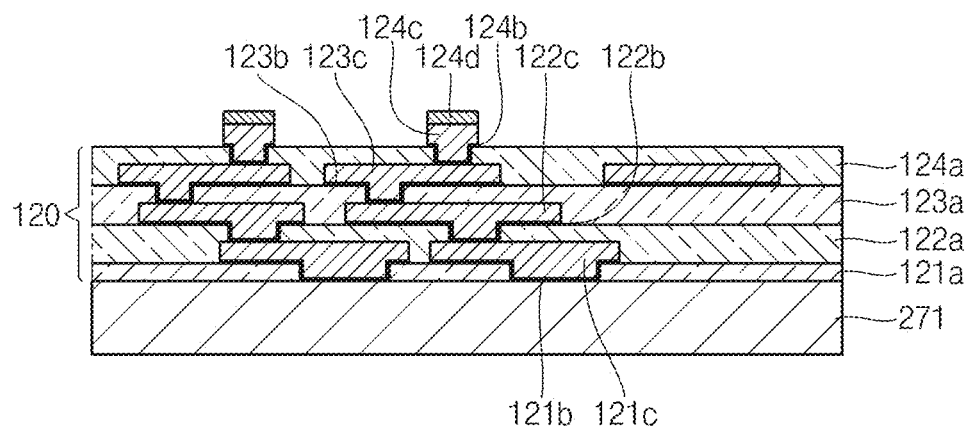

FIG. 4B shows a process of forming substrate 120 at a later stage of manufacture. In the example shown in FIG. 4B, substantially planar substrate 120 can be directly formed or built up on carrier 271. In an example, dielectric layers 121a, 122a, 123a and 124a and conductive layers 121b, 122b, 123b, 124b, 121c, 122c, 123c, 124c and 124d can be built up sequentially upon each other on carrier 271, thereby completing substrate 120.

In some examples, dielectric layer 121a can cover a top surface of carrier 271. Since the top surface of carrier 271 is formed to be planar, dielectric layer 121a can also be formed to be planar. In some examples, dielectric layer 121a can be referred to as a passivation layer, an insulation layer or a protection layer. Dielectric layer 121a can be made of any of a variety of electrically non-conductive materials (e.g., $Si_3N_4$, $SiO_2$, SiON, polyimide (PI), benzocyclobutene (BCB), polybenzoxazole (PBO), bismaleimide triazine (BT), epoxy resin, phenol resin, silicone resin, acrylate polymer, or an equivalent thereof). In addition, dielectric layer 121a can be formed using any of a variety of processes (e.g., PVD, CVD, MOCVD, ALD, LPCVD, PECVD, printing, spin coating, spray coating, sintering, thermal oxidation, or an equivalent thereof). In some examples, dielectric layer 121a can be patterned to form an opening exposing a portion of carrier 271. Dielectric layer 121a can have a thickness in the range from approximately 1 µm to approximately 10 µm and opening can have a width in the range from approximately 5 µm to approximately 70 µm.

In some examples, conductive layer 121b can be entirely formed on dielectric layer 121a and exposed regions of carrier 271. In some examples, conductive layer 121b can be referred to as a seed layer or base layer. In some examples, seed layer 121b can be formed on a top surface of dielectric layer 121a, a side wall of the opening, and a top surface of carrier 271, respectively, and all of these conductive layers 121b can be electrically connected to each other.

In some examples, seed layer 121b can be made of any of a variety of electrically conductive materials (e.g., titanium, tungsten, titanium/tungsten, copper, gold, silver, palladium, nickel or an equivalent thereof). In addition, in some examples, seed layer 121b can be formed using any of a variety of processes (e.g., sputtering, electroless plating, electroplating, PVD, CVD, MOCVD, ALD, LPCVD, PECVD, or an equivalent thereof. Seed layer 121b can have a thickness in the range from approximately 500 Å to approximately 3000 Å. Seed layer 121b can facilitate forming conductive layer 121c to a predetermined thickness at a later stage of manufacture.

Although not shown, a mask can be formed on seed layer 121b to then be patterned by a general photolithographic etching process. In some examples, seed layer 121b can be exposed to the outside by the patterned mask. In some examples, the mask can be referred to as a photoresist or a resin.

In some examples, conductive layer 121c that is relatively thick can be formed in the openings of the patterned mask on the exposed portions of seed layer 121b that is relatively thin. Here, since a pattern has already been formed using the mask, relatively thick conductive layer 121c can be formed only within the openings of the pattern. In some examples, conductive layer 121c can be referred to as a redistribution layer (RDL), a wiring pattern or a circuit pattern. In some examples, redistribution layer 121c can be made of any of a variety of electrically conductive materials (e.g., copper, gold, silver or an equivalent thereof). Redistribution layer 121c can be formed using any of a variety, of processes (e.g., sputtering, electroless plating, electroplating, PVD, CVD, MOCVD, ALD, LPCVD, PECVD, or an equivalent thereof). After redistribution layer 121c is formed, the patterned mask can be removed. Additionally, relatively thin seed layer 121b formed under the patterned mask can be removed using a soft etching process after the patterned mask is removed. Redistribution layer 121c can have a thickness in the range from approximately 2 μm to approximately 10 μm. Redistribution layer 121c can function to electrically connect interconnects 131 and 132 of electronic device 130 to conductive post 212 of base structure 210.

The aforementioned processes can be repeated multiple times, thereby completing substrate 120 on carrier 271. Here, conductive layer 124c formed on the topmost surface of substrate 120 can be referred to as a conductive pad, a micro pad or a bond pad. In some examples, conductive pad 124c can be formed to protrude a predetermined height from the top surface of substrate 120. Conductive pad 124c can have a width in the range from approximately 2 μm to approximately 80 μm.

In some examples, in order to prevent conductive pad 124c from being oxidized, an antioxidant layer 124d can be further formed on a top surface of conductive pad 124c. In some examples, antioxidant layer 124d can be made of tin, gold, silver, nickel, palladium or an equivalent thereof. Antioxidant layer 124d can be referred to as a corrosion prevention layer or a solder spread improvement layer. Antioxidant layer 124d can be formed using any of a variety of processes (e.g., sputtering, electroless plating, electroplating, PVD, CVD, MOCVD, ALD, LPCVD, PECVD, or an equivalent thereof). Antioxidant layer 124d can have a width in the range from approximately 1 μm to approximately 80 μm.

In some examples, substrate 120 can be referred to as an interconnection structure, a build-up structure, a circuit stack structure, a RDL structure, or a printed circuit board. In the example showing this disclosure, substrate 120, which comprises four dielectric layers 121a, 122a, 123a and 124a, four conductive layers 121b, 122b, 123b and 124b and four conductive layers 121c, 122c, 123c and 124c, is illustrated. However, the quantity of these layers can be smaller than or greater than four.

Figure 4C:
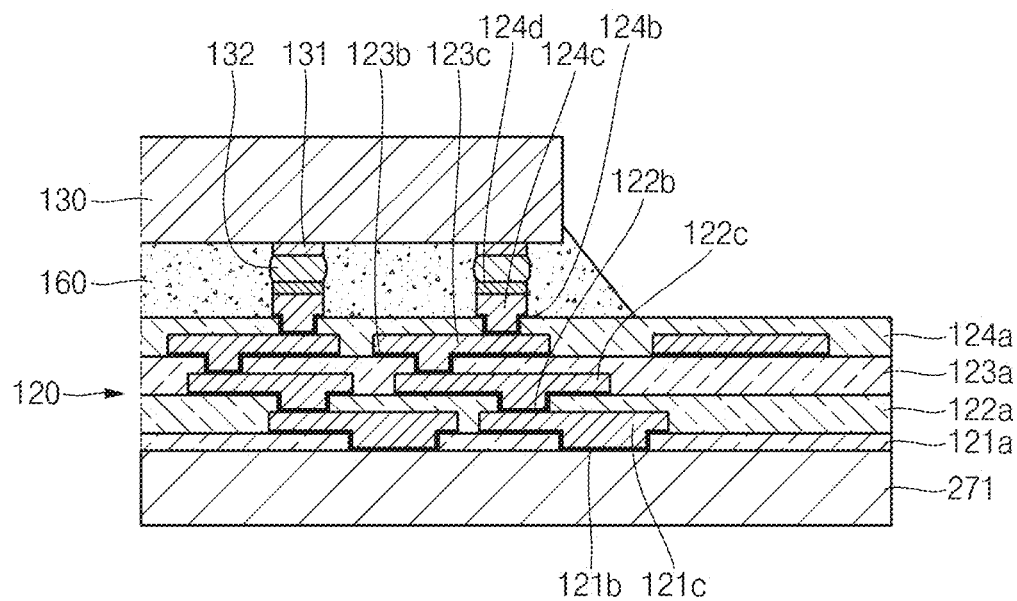

FIG. 4C shows a process of attaching electronic device 130 at a later stage of manufacture. In the example shown in FIG. 4C, the process of attaching electronic device 130 can be similar to that of attaching electronic device 130 shown in FIG. 2F.

Figure 4D:
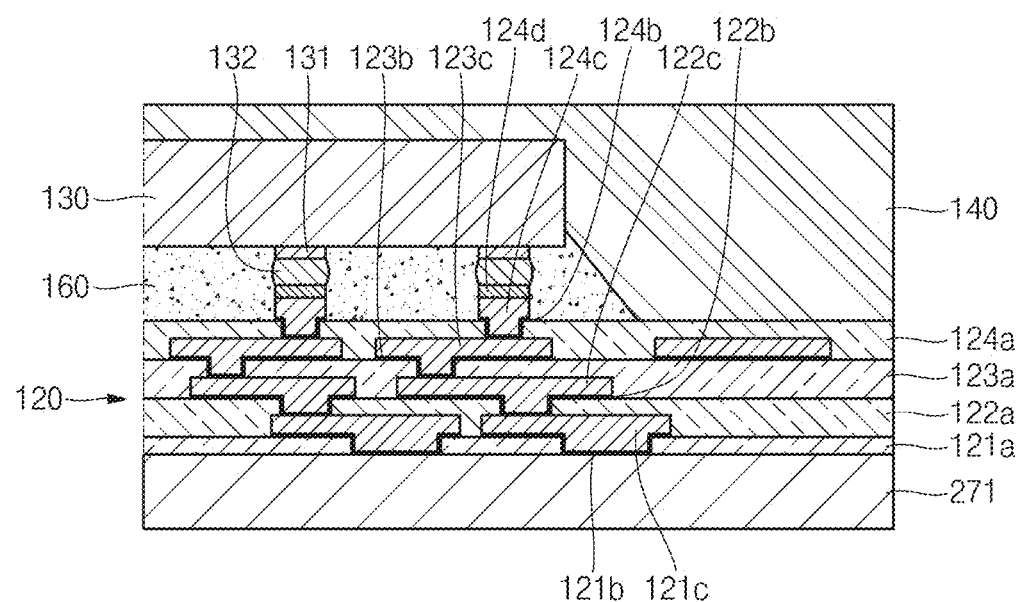

FIG. 4D shows an encapsulating process at a later stage of manufacture. In the example shown in FIG. 4D, the encapsulating process can be the same as or similar to that of FIG. 2G.

Figure 4E:
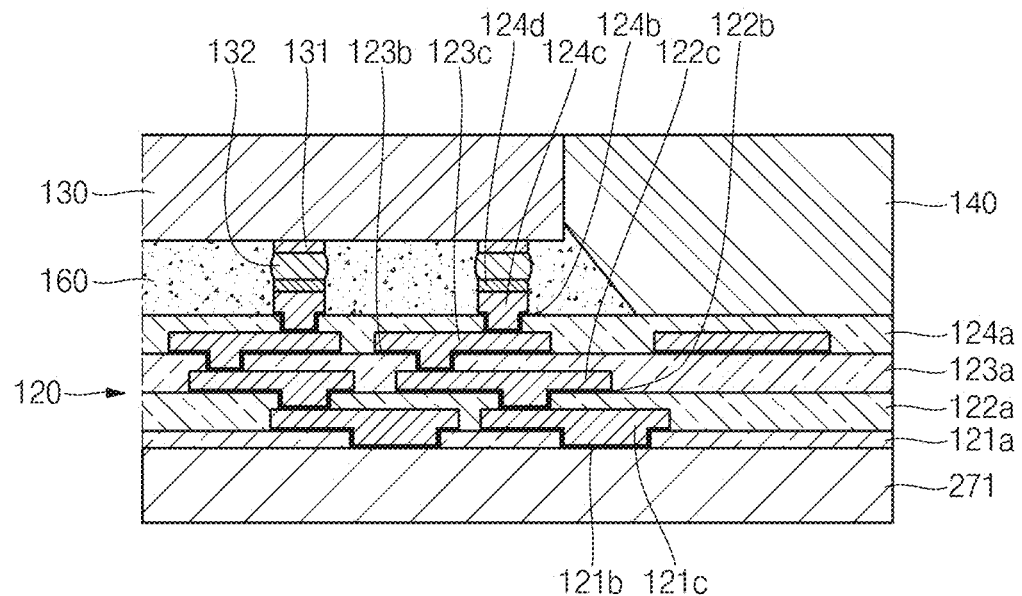

FIG. 4E shows a process of removing a portion of molding part 140 at a later stage of manufacture. In the example shown in FIG. 4E, the removing process can be the same as or similar to that of in FIG. 2H.

Figure 4F:
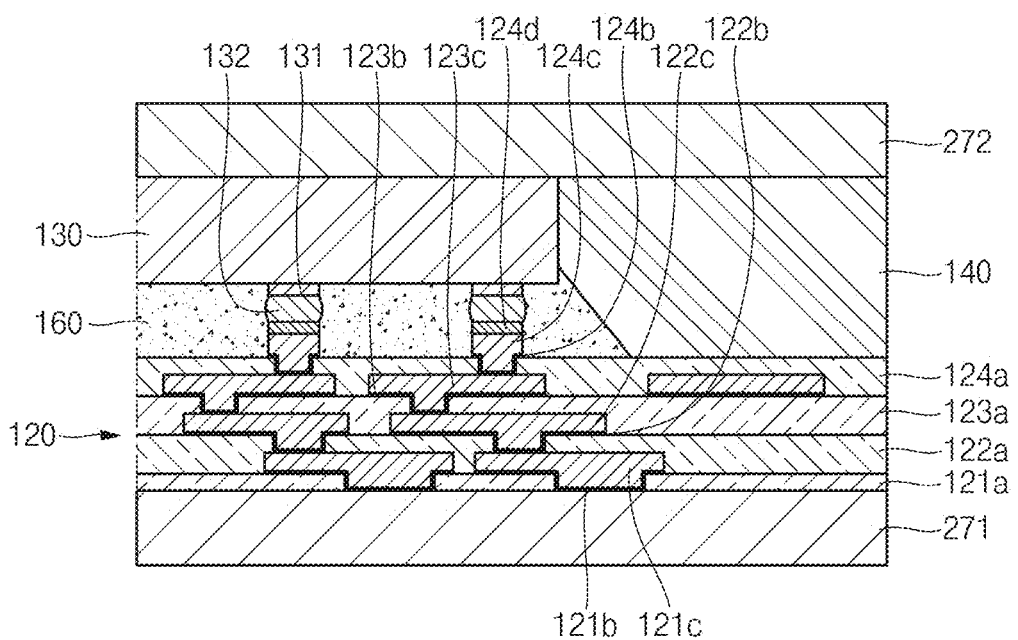

FIG. 4F shows a process of attaching carrier 272 at a later stage of manufacture. The process of attaching carrier 272 shown in FIG. 4F can be the same as or similar to that of attaching carrier 272 in FIG. 2I.

Figure 4G:
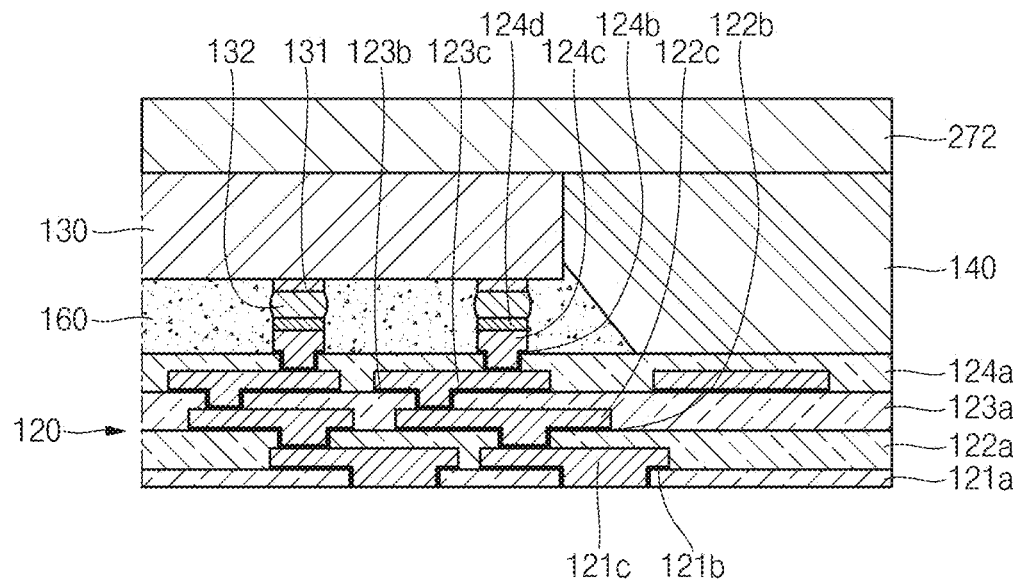

FIG. 4G shows a process of removing carrier 271 at a later stage of manufacture. In the example shown in FIG. 4G, carrier 271 can be removed from substrate 120. In some examples, carrier 271 can be removed by grinding and/or etching. In some examples, when grinding and/or etching is performed on carrier 271, seed layer 121b formed on the bottom surface of substrate 120 can be removed. In some examples, the bottom surface of redistribution layer 121c can be removed. Therefore, the bottom surface of redistribution layer 121c of substrate 120 can be exposed to the outside through dielectric layer 121a. In some examples, the bottom surface of redistribution layer 121c can be coplanar with the bottom surface of dielectric layer 121a.

Figure 4H:
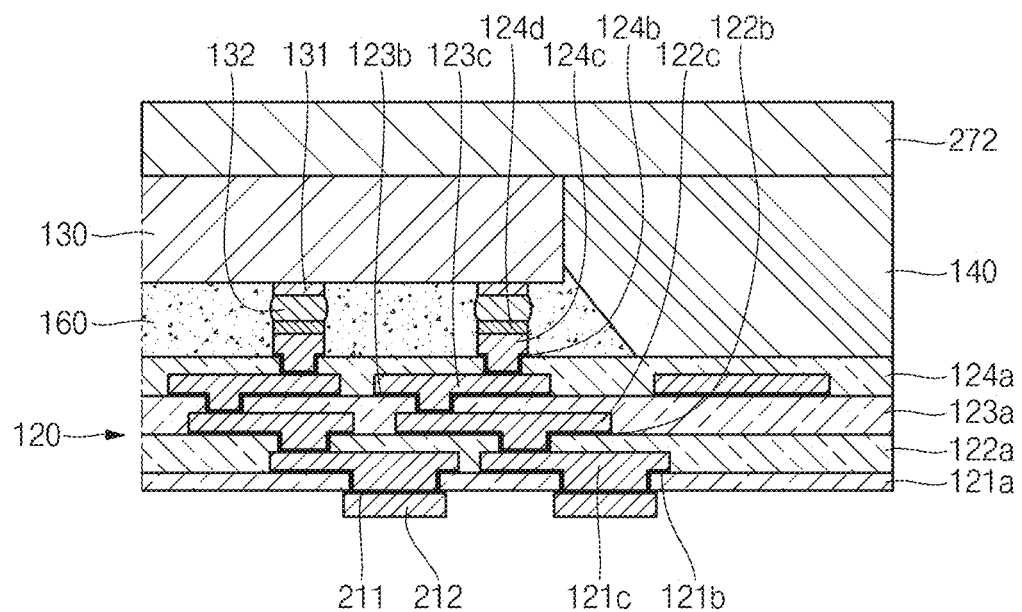

FIG. 4H shows a process of forming conductive layers 211 and 212 at a later stage of manufacture. In the example shown in FIG. 4H, conductive layers 211 and 212 can be formed on the bottom surface of substrate 120. In some examples, conductive layers 211 and 212 can be formed on dielectric layer 121a of substrate 120 and the bottom surface of redistribution layer 121c. In some examples, conductive layer 211 can be referred to as a seed layer or a base layer. In some examples, seed layer 211 can be made of any of a variety of electrically conductive materials (e.g., titanium, tungsten, titanium/tungsten, copper, gold, silver, palladium, nickel, or an equivalent thereof). In addition, in some examples, seed layer 211 can be formed using any of a variety of processes (e.g., sputtering, electroless plating, electroplating, PVD, CVD, MOCVD, ALD, LPCVD, PECVD, or an equivalent thereof). Seed layer 211 can have a thickness in the range from approximately 500 Å to approximately 3000 Å. Seed layer 211 can facilitate forming conductive layer 212 to a predetermined thickness at a later stage of manufacture.

In addition, in the example shown in FIG. 4H, conductive layer 212 that is relatively thick can be formed on seed layer 211 that is relatively thin. In some examples, a pattern or opening can be formed on seed layer 211 using a patterned mask and conductive layer 212 can be formed only within the pattern or opening. In some examples, conductive layer 212 can be formed in the openings of the patterned mask on the exposed portions of seed layer 211. Here, since a pattern has already been formed using the mask, conductive layer 212 can be formed only within the openings of the formed pattern. In some examples, conductive layer 212 can be referred to as a conductive post or an under bump metal. In some examples, conductive post 212 can be made of any of a variety of electrically conductive materials (e.g., copper, gold, silver, or an equivalent thereof). Conductive post 212 can be formed using any of a variety of processes (e.g., sputtering, electroless plating, electroplating, PVD, CVD, MOCVD, ALD, LPCVD, PECVD, or an equivalent thereof). After conductive post 212 is formed, the patterned mask can be removed. Additionally, relatively thin seed layer formed around relatively thick conductive post 212 can also be removed using a soft etching process. Conductive post 212 can have a thickness in the range from approximately 1 µm to approximately 10 µm. Conductive post 212 can be electrically connected to interconnect 150 to be formed under substrate 120 and/or base structure 210 at later stages of manufacture.

Figure 4I:
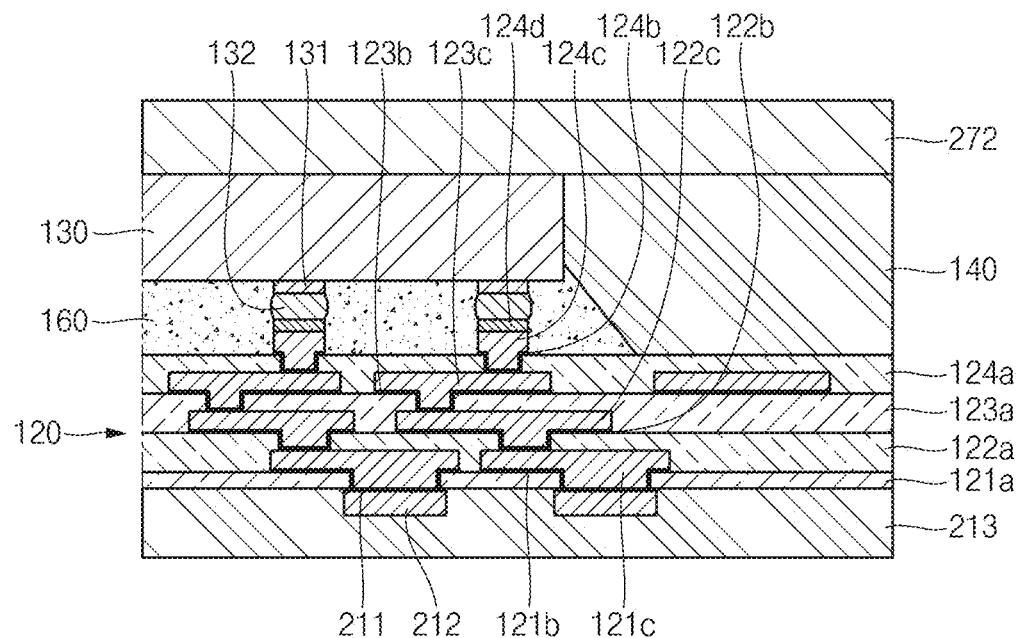

FIG. 4I shows a process of forming dielectric layer 213 at a later stage of manufacture. In the example shown in FIG. 4I, conductive post 212 formed under substrate 120 can be covered by dielectric layer 213. In some examples, dielectric layer 213 can cover bottom and side surfaces of conductive post 212. Dielectric layer, however, 213 may not cover a top surface of conductive post 212. In some examples, dielectric layer 213 may not cover the bottom surface of conductive post 212, thereby allowing the bottom surface of conductive post 212 to be exposed to the outside through dielectric layer 213. In some examples, dielectric layer 213 can be referred to as an encapsulant, a sealant, an epoxy molding compound or an epoxy molding resin. In addition, in some examples, encapsulant 213 can be referred to as an encapsulation part, a molding part, a protection part, or a body. In some examples, encapsulant 213 can comprise, but not limited to, an organic resin, an inorganic filler, a curing agent, a catalyst, a colorant, a flame retardant, or equivalents of the foregoing. Encapsulant 213 can be formed by any of a variety of processes. In some examples, encapsulant 213 can be formed by, but not limited to, compression molding, transfer molding, liquid-phase encapsulant molding, vacuum lamination, paste printing or film assist molding. Encapsulant 213 can have a thickness in the range from approximately 1 µm to approximately 10 µm. Encapsulant 213 can firmly encapsulate conductive post 212 to reduce or prevent substrate 120 from warping at a later stage.

Figure 4J:
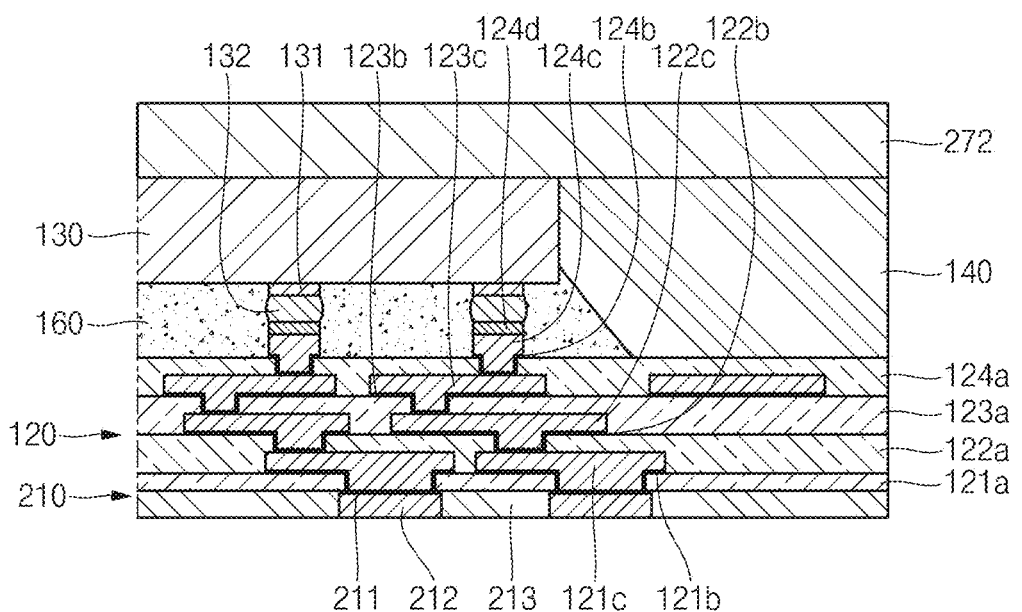

FIG. 4J shows a removing process at a later stage of manufacture. In the example shown in FIG. 4J, conductive post 212 and a bottom surface of encapsulant 213 are subjected to grinding or etching to expose the bottom surface of conductive post 212 to the outside through the bottom surface of encapsulant 213. In some examples, the bottom surface of conductive post 212 and the bottom surface of encapsulant 213 can be formed to be coplanar. As described above, base structure 210 can be completed and interconnects 150 can be formed under base structure 210 at a later stage of manufacture.

Figure 4K:
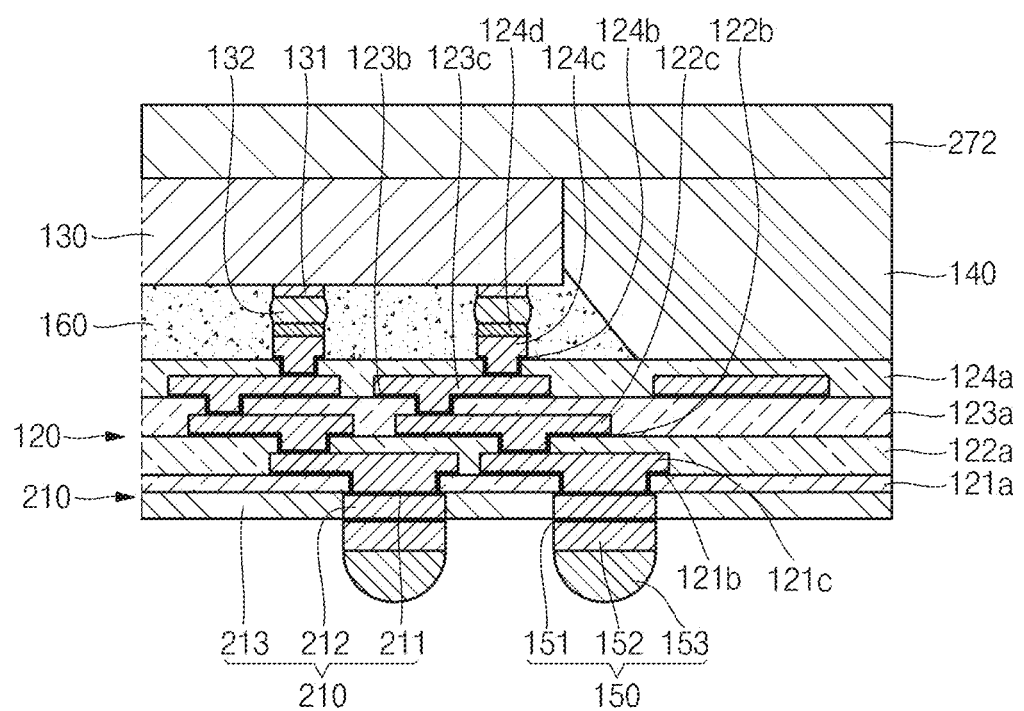

FIG. 4K shows a process of forming interconnects 150 at a later stage of manufacture. In the example shown in FIG. 4K, the process of forming interconnects 150 can be substantially the same with the process of forming interconnects 150 shown in FIG. 2K.

Meanwhile, carrier 272 can be removed. As described above, the top surface of electronic device 130 can be coplanar with a top surface of encapsulant 140 on semiconductor device 200.

In summary, a semiconductor device comprises a redistribution layer (RDL) substrate having a top surface and a bottom surface, wherein the RDL substrate comprises a filler-free dielectric material, an electronic device on the top surface of the RDL substrate, an electrical interconnect on the bottom surface of the RDL substrate and electrically coupled to the electronic device, a first protective material contacting a side surface of the electronic device and the top surface of the RDL substrate, and a second protective material contacting a side surface of the electrical interconnect and the bottom surface of the RDL substrate.

A method to manufacture a semiconductor device comprises forming a base structure having a conductive post, forming a redistribution layer (RDL) substrate on the base structure, placing an electronic device on a top surface of the RDL substrate, and forming a protective material contacting a side surface of the electronic device and the top surface of the RDL substrate.

An alternative method to manufacture a semiconductor device comprises forming a redistribution layer (RDL) substrate on a first carrier, the RDL substrate having a top surface and a bottom surface, placing an electronic device on the top surface of the RDL substrate, forming a first protective material using a first molding operation, wherein the first protective material contacts a side surface of the electronic device and the top surface of the RDL substrate, attaching a second carrier to the first protective material, removing the first carrier from the RDL substrate, forming a conductive post on the bottom surface of the RDL substrate using a first plating operation, and forming a second protective material using a second molding operation, wherein the second protective material contacts a side surface of the conductive post and the bottom surface of the RDL substrate.

The present disclosure includes reference to certain examples. It will be understood, however, by those skilled in the art that various changes may be made, and equivalents may be substituted, without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A method to manufacture a semiconductor device, comprising:
    providing a redistribution layer (RDL) substrate comprising a top side, a bottom side opposite the top side, and a conductive layer, wherein the conductive layer includes a plurality of pads, the plurality of pads including a first portion below the top side of the RDL substrate and a second portion protruding above the top side of the RDL substrate;
    disposing an electronic device on the plurality of pads;
    providing a first protective material over a lateral side of the electronic device and the top side of the RDL substrate;
    providing a conductive post on the bottom side of the RDL substrate using a first plating operation;
    providing a base structure on the bottom side of the RDL substrate, the base structure comprising a second protective material covering a lateral side of the conductive post and the bottom side of the RDL substrate;
    providing a base layer on a bottom side of the conductive post, wherein a lateral side of the base layer is exposed; and
    providing an external interconnect on a bottommost side of the base layer and coupled with the conductive post, wherein the external interconnect is coupled with the conductive post through an opening in the base layer.

2. The method of claim 1, wherein providing the external interconnect on the base layer comprises:
providing a pillar on the base layer using a second plating operation; and
providing a solder cap on the pillar.

3. The method of claim 1, wherein the base layer comprises a conductive material.

4. The method of claim 1, wherein:
the RDL substrate is provided on a first carrier; and
further comprising:
attaching a second carrier to the first protective material; and
removing the first carrier from the RDL substrate to expose the bottom side of the RDL substrate and the conductive layer.

5. The method of claim 4, wherein the first carrier is removed using a grinding or etching operation.

6. The method of claim 4, wherein providing the external interconnect on the base layer comprises:
providing a pillar on the base layer using a second plating operation; and
providing a solder cap on the pillar; and
further comprising removing the second carrier after the solder cap is provided.

7. The method of claim 1, wherein:
the second protective material is provided in a first molding operation; and
the first protective material is provided in a second molding operation.

8. A method to manufacture a semiconductor device, comprising:
providing a redistribution layer (RDL) substrate having a top side and a bottom side, wherein the RDL substrate comprises a filler-free dielectric material, and wherein the RDL substrate comprises a conductive layer exposed from the bottom side, and wherein the conductive layer includes a plurality of pads, the plurality of pads including a first portion below the top side of the RDL substrate and a second portion protruding above the top side of the RDL substrate;
providing an electronic device on the plurality of pads;
providing a conductive post on the bottom side of the RDL substrate and electrically coupled to the electronic device;
providing a first protective material over a lateral side of the electronic device and the top side of the RDL substrate;
providing a base structure on the bottom side of the RDL substrate, the base structure comprising a second protective material on a lateral side of the conductive post and the bottom side of the RDL substrate; and
providing an external interconnect below a bottom side of the base structure to couple with the conductive post, wherein the external interconnect is coupled with the conductive post through an opening in the base structure, wherein the external interconnect directly contacts the conductive post.

9. The method of claim 8, wherein the external interconnect comprises a conductive pillar and an interconnect tip on the conductive pillar.

10. The method of claim 8, wherein the external interconnect comprises a conductive pillar and a conductive bump on the conductive pillar.

11. The method of claim 8, wherein the external interconnect comprises a solder ball.

12. The method of claim 8, wherein the RDL substrate comprises a dielectric layer.

13. The method of claim 8, wherein the first protective material and the second protective material comprise a same material having a same coefficient of thermal expansion (CTE).

14. The method of claim 8, wherein the first protective material and the second protective material comprise different materials having a same coefficient of thermal expansion (CTE).

15. The method of claim 8, wherein the first protective material has a first coefficient of thermal expansion (CTE) and a first thickness, and the second protective material has a second CTE and a second thickness such that warpage between the first protective material and the RDL substrate counters warpage between the second protective material and the RDL substrate.

16. The method of claim 8, wherein:
the second protective material is provided in a first molding operation; and
the first protective material is provided in a second molding operation.

17. A semiconductor device, comprising:
a redistribution layer (RDL) substrate comprising a top side, a bottom side opposite the top side, and a conductive layer, wherein the conductive layer includes a plurality of pads, the plurality of pads including a first portion below the top side of the RDL substrate and a second portion protruding above the top side of the RDL substrate;
an electronic device on the plurality of pads;
a first protective material over a lateral side of the electronic device and the top side of the RDL substrate;
a conductive post on the bottom side of the RDL substrate using a first plating operation;
a base structure on the bottom side of the RDL substrate, the base structure comprising a second protective material covering a lateral side of the conductive post and the bottom side of the RDL substrate;
a base layer on a bottom side of the conductive post, wherein a lateral side of the base layer is exposed; and
an external interconnect on a bottommost side of the base layer and coupled with the conductive post, wherein the external interconnect is coupled with the conductive post through an opening in the base layer.

18. The semiconductor device of claim 17, wherein the external interconnect on the base layer comprises:
a pillar on the base layer; and
a solder cap on the pillar.

19. The semiconductor device of claim 18, wherein the pillar extends beyond a bottom side of the second protective material.

20. The semiconductor device of claim 17, wherein the base layer comprises a conductive material.

* * * * *